(12) United States Patent
Kim et al.

(10) Patent No.: US 12,490,566 B2
(45) Date of Patent: Dec. 2, 2025

(54) DISPLAY DEVICE USING SEMICONDUCTOR LIGHT-EMITTING ELEMENTS

(71) Applicant: LG ELECTRONICS INC., Seoul (KR)

(72) Inventors: Jungsub Kim, Seoul (KR); Sunghyun Moon, Seoul (KR); Younghak Chang, Seoul (KR); Jina Jeon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 738 days.

(21) Appl. No.: 17/259,084

(22) PCT Filed: Aug. 29, 2018

(86) PCT No.: PCT/KR2018/009957
§ 371 (c)(1),
(2) Date: Jan. 8, 2021

(87) PCT Pub. No.: WO2020/013379
PCT Pub. Date: Jan. 16, 2020

(65) Prior Publication Data
US 2021/0320146 A1    Oct. 14, 2021

(30) Foreign Application Priority Data
Jul. 11, 2018   (KR) .......................... 10-2018-0080713

(51) Int. Cl.
*H10H 29/14*    (2025.01)
*H10H 20/01*    (2025.01)
(Continued)

(52) U.S. Cl.
CPC .......... *H10H 29/142* (2025.01); *H10H 20/01* (2025.01); *H10H 20/82* (2025.01);
(Continued)

(58) Field of Classification Search
CPC ... H01L 25/075; H01L 25/0753; H01L 25/13; H01L 25/167; H10H 29/857; H10H 29/142; H10H 29/24
See application file for complete search history.

(56) References Cited

U.S. PATENT DOCUMENTS

2011/0006316 A1*   1/2011   Ing ................... G02F 1/133606
257/89
2013/0235292 A1   9/2013   Hara et al.
(Continued)

FOREIGN PATENT DOCUMENTS

EP   2 741 341 A1   6/2014
EP   3 182 470 A1   6/2017
(Continued)

*Primary Examiner* — Jesse Y Miyoshi
(74) *Attorney, Agent, or Firm* — Birch, Stewart, Kolasch & Birch, LLP

(57) ABSTRACT

A display device is discussed. The Display device includes a plurality of semiconductor light-emitting elements on a substrate, wherein the substrate includes: a base substrate; an insulating layer on the base substrate; and pads protruding farther than the insulating layer and enabling the semiconductor light-emitting elements to in contact, wherein the insulating layer includes inorganic particles, and at least a portion of some of the inorganic particles is formed so as to protrude from a surface of the insulating layer.

20 Claims, 15 Drawing Sheets

(51) Int. Cl.
  *H10H 20/82*   (2025.01)
  *H10H 20/857*  (2025.01)
  *H10H 29/24*   (2025.01)
  *H10H 29/85*   (2025.01)

(52) U.S. Cl.
  CPC .......... *H10H 20/857* (2025.01); *H10H 29/24* (2025.01); *H10H 29/857* (2025.01); *H10H 20/0364* (2025.01)

(56)        References Cited

U.S. PATENT DOCUMENTS

2014/0367705 A1    12/2014  Bibl et al.
2015/0036317 A1*    2/2015  Yamamoto ................ F21V 9/08
                                                       362/84
2017/0345982 A1*   11/2017  Abe .................... H01L 25/0753

FOREIGN PATENT DOCUMENTS

JP            4772395 B2    9/2011
JP         2012-227293 A   11/2012
KR        10-2014-0047123 A  4/2014
KR        10-2016-0043615 A  4/2016
KR        10-2018-0033645 A  4/2018
KR         10-2018-007860 A  7/2018
KR        10-2018-0063687 A  8/2018
WO        WO 2012/144493 A1 10/2012
WO        WO 2014/140796 A1  9/2014

* cited by examiner (a)

(b)

(c)

(a)

1010  1011a 1011b  1012a 1013'
       1011'

(b) (dry etching)

1010  1011a 1011b  1012a 1013'
       1011'

(c)

1001a 1010  1011a 1011b  1012a
       1011'

(a)

(b)

(c)

(a)

(b)

DISPLAY DEVICE USING SEMICONDUCTOR LIGHT-EMITTING ELEMENTS

CROSS REFERENCE TO RELATED APPLICATIONS

This application is the National Stage filing under 35 U.S.C. 371 of International Application No. PCT/KR2018/009957, filed on Aug. 29, 2018, which claims the benefit of earlier filing date and right of priority to Korean Application No. 10-2018-0080713, filed on Jul. 11, 2018, the contents of all these applications are hereby incorporated by reference herein in their entirety.

BACKGROUND

1. Technical Field

The present disclosure relates to a display device and a manufacturing method thereof, and more particularly, to a flexible display device using a semiconductor light-emitting element.

2. Description of the Related Art

In recent years, display devices having excellent characteristics such as low profile, flexibility and the like have been developed in the display technical field. On the contrary, currently commercialized main displays are represented by liquid crystal displays (LCDs) and active-matrix organic light-emitting diodes (AMOLEDs).

However, there exist problems such as not-so-fast response time, difficult implementation of flexibility in case of LCDs, and there exist drawbacks such as short life span, not-so-good yield as well as low flexibility in case of AMOLEDs.

On the other hand, light-emitting diodes (LEDs) are well known light-emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light-emitting elements may be used to implement a display, thereby presenting a scheme for solving the problems.

In a display device using the semiconductor light-emitting element of the present disclosure described above, a laser lift-off (LLO) method or a chemical lift-off (CLO) method may be used to separate the semiconductor light-emitting element from the growth substrate.

Moreover, a stamp method or an electrostatic chuck method may be performed as a method of separating the semiconductor light-emitting element from the growth substrate and assembling the semiconductor light-emitting element on the substrate. When assembling the semiconductor light-emitting element using an electrostatic chuck, there is a problem that the number of semiconductor light-emitting elements that can be mounted on the electrostatic chuck is limited, and the maintenance cost of the electrostatic chuck is high.

Meanwhile, the stamp method is a method of stamping a substrate on a growth substrate having an anchor structure to assemble the semiconductor light-emitting element, over-transfer failure may occur in which semiconductor light-emitting elements that do not want to be assembled are transferred onto the substrate. Process conditions such as temperature and pressure may be adjusted to prevent over-transfer of the semiconductor light-emitting element in the stamp method. However, there is a problem that a non-transfer problem occurs in the process of lowering the temperature and pressure in order to prevent overtransfer, resulting in poor processability.

As described above, in the case of a display using a semiconductor light-emitting element, overtransfer failure occurs in the process of assembling the semiconductor light-emitting element, and this needs to be improved. Accordingly, in the present disclosure, a structure of a display device in which overtransfer failure is improved during the assembly process of the display device is presented.

SUMMARY

An aspect of the present disclosure is to provide a display device in which overtransfer failure is prevented in the process of assembling a semiconductor light-emitting element on a growth substrate, and a manufacturing method thereof.

In addition, another aspect of the present disclosure is to provide a display device capable of improving process speed, and a manufacturing method thereof.

A display device according to the present disclosure may have a plurality of semiconductor light-emitting elements on a substrate, and the substrate may include a base substrate; an insulating layer provided on the base substrate; and a pad formed to protrude more than the insulating layer and formed to assemble the semiconductor light-emitting element, wherein the insulating layer includes inorganic particles, and at least part of the inorganic particles are formed to protrude from a surface of the insulating layer.

According to an embodiment, the insulating layer may include at least one of a siloxane resin, an epoxy resin, and an acrylic resin.

According to an embodiment, the inorganic particles may include at least one selected from a group consisting of $SiO_x$, $TiO_x$, $AlO_x$, and $ZnO_x$.

According to an embodiment, the pad may include at least one of a siloxane resin, an epoxy resin, and an acrylic resin.

According to an embodiment, wiring may be formed on the base substrate, and the pad may be selected from a group consisting of AuSn, InSn and In.

According to an embodiment, the insulating layer may have a groove recessed toward the base substrate, and the pad may be disposed in the recessed groove.

In addition, a method of manufacturing a display device according to the present disclosure may include forming an insulating layer comprising inorganic particles on a base substrate; forming a pad protruding more than the insulating layer; forming a pad passivation layer on the pad; etching the insulating layer to form an insulating layer in which the inorganic particles protrude from the surface; and removing the pad passivation layer, and assembling a semiconductor light-emitting element on the pad.

According to an embodiment, in said forming an insulating layer, the insulating layer may include at least one of a siloxane resin, an epoxy resin, and an acrylic resin.

According to an embodiment, in said forming an insulating layer, the inorganic particles may include at least one selected from a group consisting of $SiO_x$, $TiO_x$, $AlO_x$, and $ZnO_x$.

According to an embodiment, the method may further include removing at least part of the insulating layer to form a groove recessed toward the base substrate between said forming an insulating layer and said forming a pad.

According to an embodiment, the pad may be formed in the recessed groove.

A display device according to the present disclosure may include an insulating layer including inorganic particles on a base substrate and a pad disposed to protrude from the insulating layer, and a semiconductor light-emitting element may be placed on the pad to separate the semiconductor light-emitting element, thereby preventing overtransfer failure during the assembly process of the semiconductor light-emitting element.

In addition, a display device in which inorganic particles protrude to a surface of the insulating layer to prevent transfer even when the semiconductor light-emitting element and the surface of the insulating layer come into contact during the assembly process of the semiconductor light-emitting element may be provided to improve the yield of selective transfer so as to process speed.

DETAILED DESCRIPTION OF THE EMBODIMENTS

Figure 1:
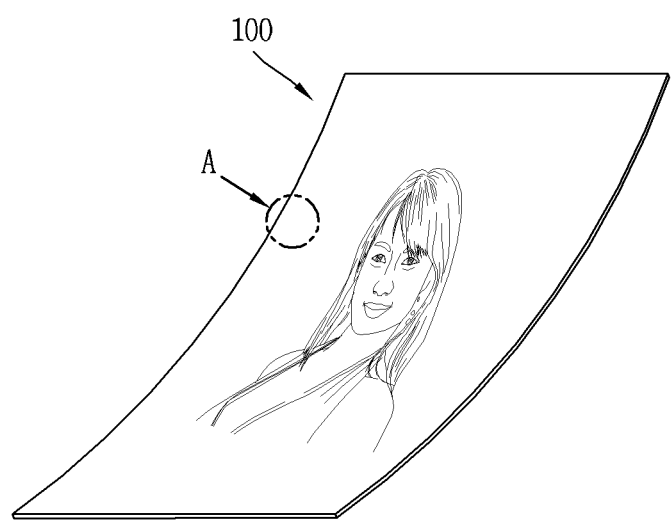
FIG. 1 is a conceptual view showing a display device using a semiconductor light-emitting element according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing an embodiment disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light-emitting element according to an embodiment of the present disclosure.

According to the drawing, information processed in the controller of the display device 100 may be displayed using a flexible display.

The flexible display may include a flexible, bendable, twistable, foldable and rollable display. For example, the flexible display may be a display manufactured on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light-emitting element. According to the present disclosure, a light-emitting diode (LED) is illustrated as a type of semiconductor light-emitting element.

The light-emitting diode may be formed with a small size to perform the role of a sub-pixel even in the second configuration through this.

Hereinafter, a flexible display implemented using the light-emitting diode will be described in more detail with reference to the accompanying drawings.

Figure 2:
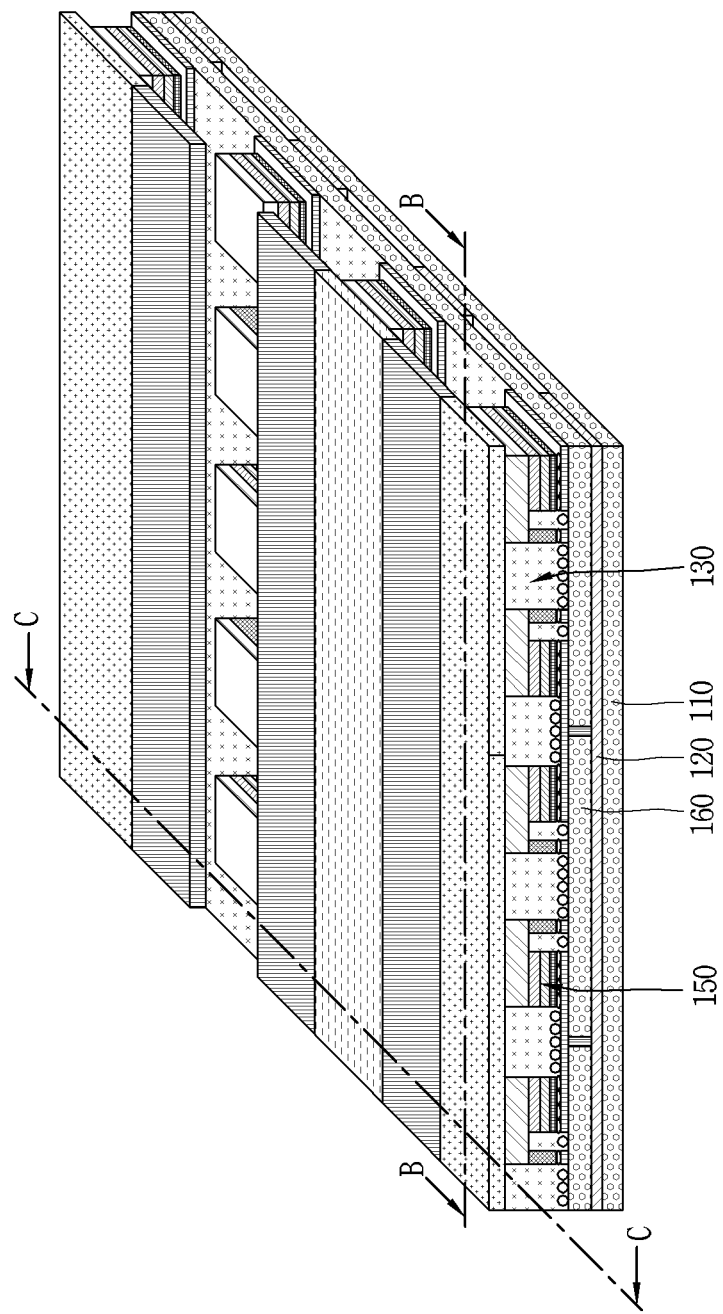
FIG. 2 is a partial enlarged view of portion "A" in FIG. 1, and FIGS. 3A and 3B are cross-sectional views taken along lines B-B and C-C in FIG. 2.
Figure 3A:
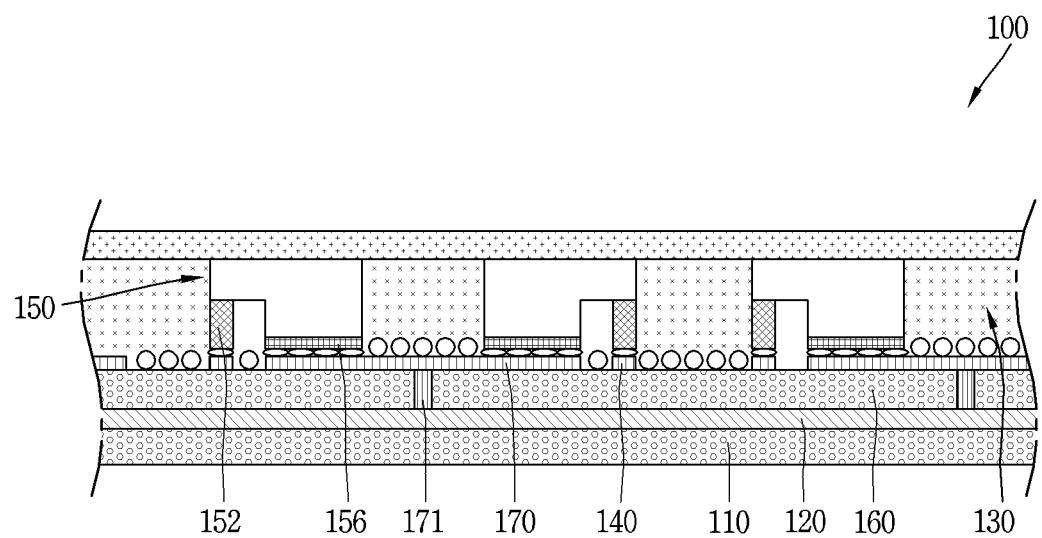
Figure 3B:
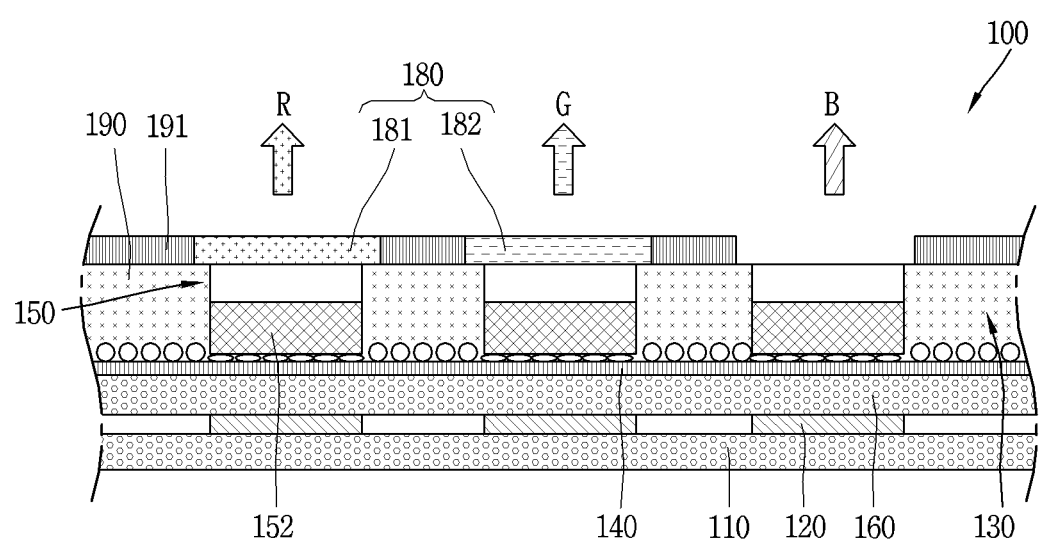
Figure 4:
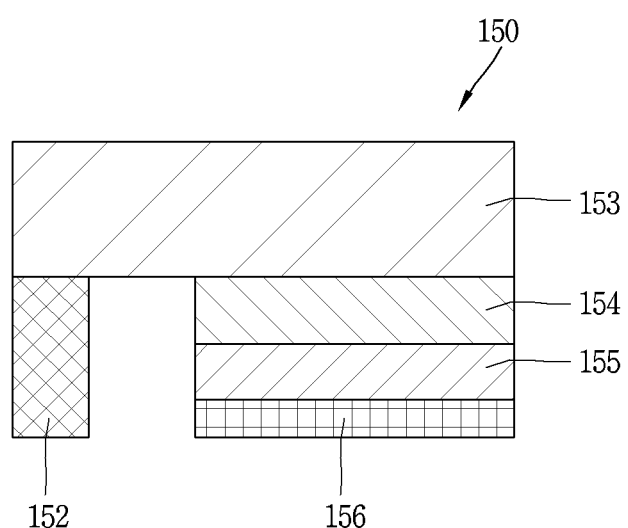
FIG. 4 is a conceptual view illustrating a flip-chip type semiconductor light-emitting element in FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light-emitting element in FIG. 3A, and FIGS. 5A through 5C are conceptual views illustrating various forms for implementing colors in connection with a flip-chip type semiconductor light-emitting element.

According to the drawings in FIGS. 2, 3A and 3B, there is illustrated a display device 100 using a passive matrix (PM) type semiconductor light-emitting element as a display device 100 using a semiconductor light-emitting element. However, an example described below may also be applicable to an active matrix (AM) type semiconductor light-emitting element.

The display device 100 may include a substrate 110, a first electrode 120, a conductive adhesive layer 130, a second electrode 140, and a plurality of semiconductor light-emitting elements 150.

The substrate 110 may be a flexible substrate. The substrate 110 may contain glass or polyimide (PI) to implement the flexible display device. In addition, if it is an insulating and flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be a single wiring substrate. More specifically, the insulating layer 160 may be incorporated into the substrate 110 with an insulating and flexible material such as polyimide (PI), PET, PEN or the like to form a single wiring substrate.

The auxiliary electrode 170 as an electrode for electrically connecting the first electrode 120 to the semiconductor light-emitting element 150 placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light-emitting element 150 is connect thereto in a flip chip form with the application of heat and pressure, the semiconductor light-emitting element 150 is electrically connected to the first electrode 120 and second electrode 140.

Referring to FIG. 4, the semiconductor light-emitting element may be a flip chip type semiconductor light-emitting element.

For example, the semiconductor light-emitting element may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light-emitting elements 150. For example, the left and right p-type electrodes of the semiconductor light-emitting elements around the auxiliary electrode may be electrically connected to one auxiliary electrode.

More specifically, the semiconductor light-emitting element 150 is pressed into the conductive adhesive layer 130, and through this, only a portion between the p-type electrode 156 and auxiliary electrode 170 of the semiconductor light-emitting element 150 and a portion between the n-type electrode 152 and second electrode 140 of the semiconductor light-emitting element 150 have conductivity, and the remaining portion does not have conductivity since there is no push-down of the semiconductor light-emitting element. As described above, the conductive adhesive layer 130 may form an electrical connection as well as allow a mutual coupling between the semiconductor light-emitting element 150 and the auxiliary electrode 170 and between the semiconductor light-emitting element 150 and the second electrode 140.

Furthermore, a plurality of semiconductor light-emitting elements 150 constitute a light-emitting array, and a phosphor layer 180 is formed on the light-emitting array.

The light-emitting device array may include a plurality of semiconductor light-emitting elements with different self-luminance values. Each of the semiconductor light-emitting elements 150 constitutes a sub-pixel, and is electrically connected to the first electrode 120. For example, there may exist a plurality of first electrodes 120, and the semiconductor light-emitting elements are arranged in several rows, for instance, and each row of the semiconductor light-emitting elements may be electrically connected to any one of the plurality of first electrodes.

Furthermore, the semiconductor light-emitting elements may be connected in a flip chip form, and thus semiconductor light-emitting elements grown on a transparent dielectric substrate. Furthermore, the semiconductor light-emitting elements may be nitride semiconductor light-emitting elements, for instance. The semiconductor light-emitting element 150 has an excellent luminance characteristic, and thus it may be possible to configure individual sub-pixels even with a small size thereof.

According to the drawing, a partition wall 190 may be formed between the semiconductor light-emitting elements 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light-emitting element 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display device. When a partition wall of a white insulator is used, an effect of enhancing reflectivity may be obtained. When a partition wall of a black insulator is used, a contrast ratio may be increased while having a reflection characteristic.

The phosphor layer 180 may be located at an outer surface of the semiconductor light-emitting element 150. For example, the semiconductor light-emitting element 150 is a blue semiconductor light-emitting element that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light-emitting element 151 at a location implementing a red sub-pixel, and a green phosphor 182 capable of converting blue light into green (G) light may be deposited on the blue semiconductor light-emitting element 151 at a location implementing a green sub-pixel. Furthermore, only the blue semiconductor light-emitting element 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light-emitting element 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
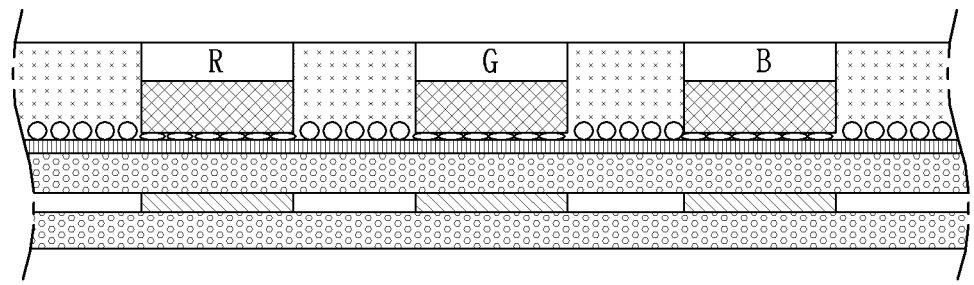
FIGS. 5A through 5C are conceptual views illustrating various forms for implementing colors in connection with a flip-chip type semiconductor light-emitting element.

Referring to FIG. 5A, each of the semiconductor light-emitting elements 150 may be implemented with a high-power light-emitting device that emits various lights including blue in which gallium nitride (GaN) is mostly used, and indium (In) and or aluminum (Al) are added thereto.

In this case, the semiconductor light-emitting element 150 may be red, green and blue semiconductor light-emitting elements, respectively, to implement each sub-pixel. For instance, red, green and blue semiconductor light-emitting elements (R, G, B) are alternately disposed, and red, green and blue sub-pixels implement one pixel by means of the red, green and blue semiconductor light-emitting elements, thereby implementing a full color display.

Figure 5B:
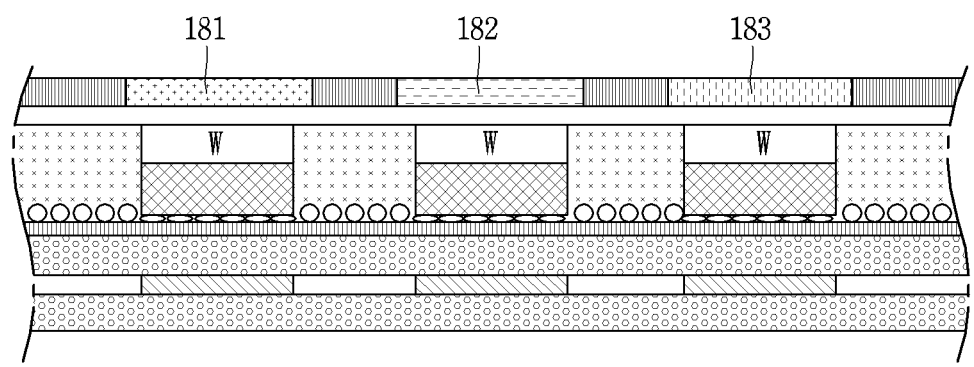

Referring to FIG. 5B, the semiconductor light-emitting element may have a white light-emitting device (W) provided with a yellow phosphor layer for each element. In this case, a red phosphor layer 181, a green phosphor layer 182 and a blue phosphor layer 183 may be provided on the white light-emitting device (W) to implement a sub-pixel. Furthermore, a color filter repeated with red, green and blue on the white light-emitting device (W) may be used to implement a sub-pixel.

Figure 5C:
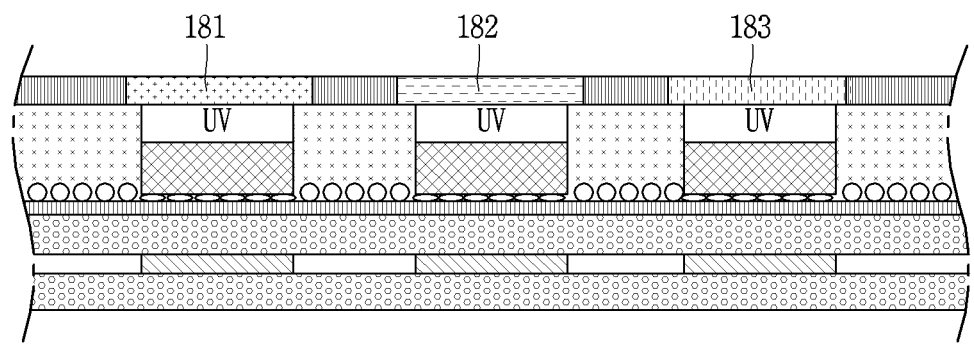

Referring to FIG. 5C, it may be possible to also have a structure in which a red phosphor layer 181, a green phosphor layer 182 and blue phosphor layer 183 may be provided on a ultra violet light-emitting device (UV). In this manner, the semiconductor light-emitting element can be used over the entire region up to ultra violet (UV) as well as visible light, and may be extended to a form of semiconductor light-emitting element in which ultra violet (UV) can be used as an excitation source.

Taking the present example into consideration again, the semiconductor light-emitting element 150 is placed on the conductive adhesive layer 130 to configure a sub-pixel in the display device. The semiconductor light-emitting element 150 has an excellent luminance characteristic, and thus it may be possible to configure individual sub-pixels even with a small size thereof. The size of the individual semiconductor light-emitting element 150 may be less than 80 μm in the length of one side thereof, and formed with a rectangular or square shaped element. In case of a rectangular shaped element, the size thereof may be less than 20×80 μm.

Furthermore, even when a square shaped semiconductor light-emitting element 150 with a length of side of 10 μm is used for a sub-pixel, it will exhibit a sufficient brightness for implementing a display device. Accordingly, for example, in case of a rectangular pixel in which one side of a sub-pixel is 600 μm in size, and the remaining one side thereof is 300 μm, a relative distance between the semiconductor light-emitting elements becomes sufficiently large. Accordingly, in this case, it may be possible to implement a flexible display device having a HD image quality.

A display device using the foregoing semiconductor light-emitting element will be manufactured by a new type of manufacturing method. Hereinafter, the manufacturing method will be described with reference to FIG. 6.

Figure 6:
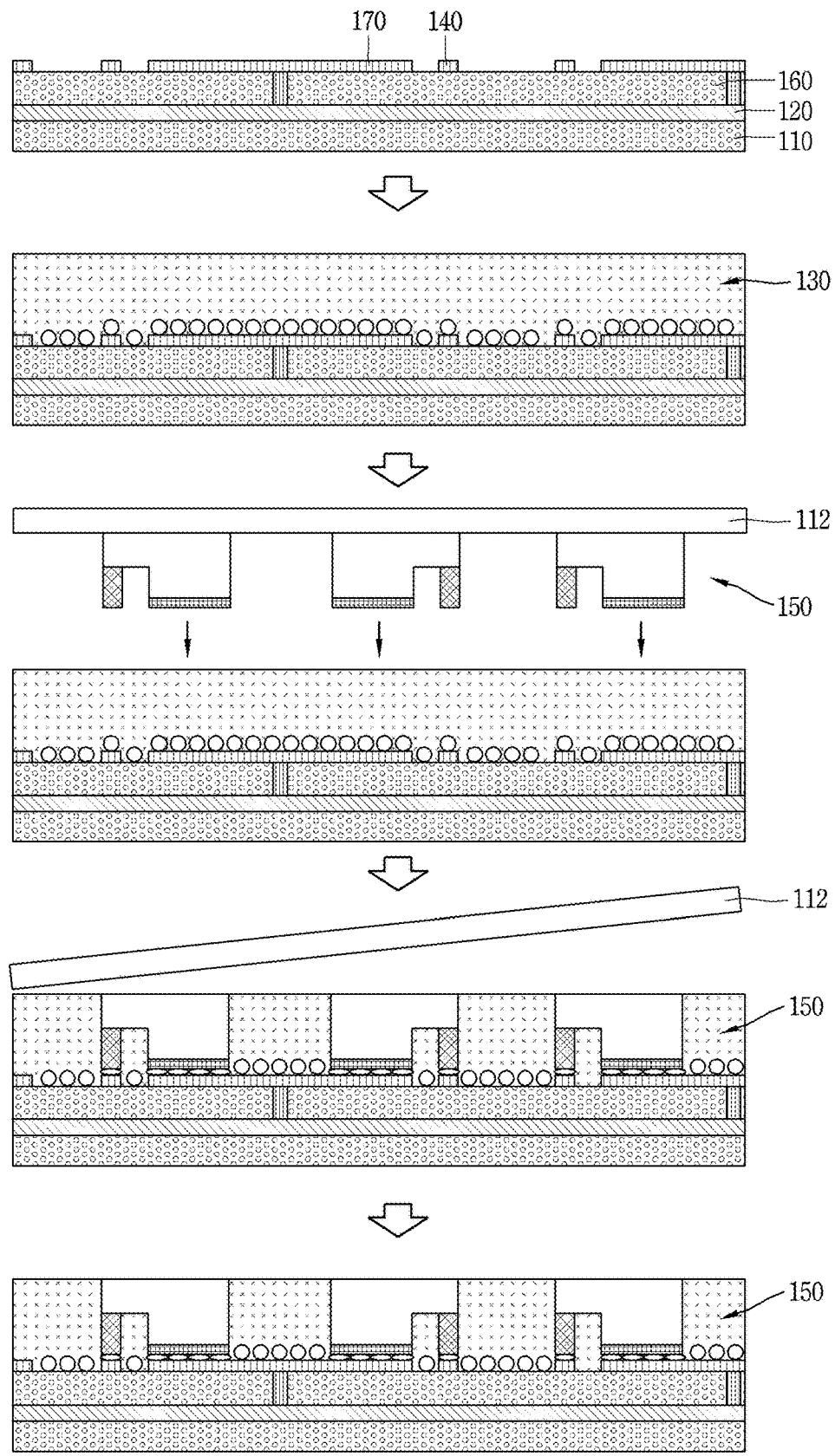
FIG. 6 is cross-sectional views illustrating a manufacturing method of a display device using a semiconductor light-emitting element according to the present disclosure.

FIG. 6 is cross-sectional views illustrating a manufacturing method of a display device using a semiconductor light-emitting element according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light-emitting elements 150 corresponding to the location of the auxiliary electrodes 170 and second electrodes 140 and constituting individual pixels is disposed such that the semiconductor light-emitting element 150 faces the auxiliary electrode 170 and second electrode 140.

In this case, the second substrate 112 as a growth substrate for growing the semiconductor light-emitting element 150 may be a sapphire substrate or silicon substrate.

The semiconductor light-emitting element may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light-emitting element 150 and the auxiliary electrode 170 and second electrode 140 may have conductivity due to the characteristics of an anisotropic conductive film having conductivity by thermal compression, thereby allowing the electrodes and semiconductor light-emitting element 150 to be electrically connected to each other. At this time, the semiconductor light-emitting element 150 may be inserted into the anisotropic conductive film, thereby forming a partition wall between the semiconductor light-emitting elements 150.

Next, the second substrate 112 is removed. For example, the second substrate 112 may be removed using a laser lift-off (LLO) or chemical lift-off (CLO) method.

Finally, the second substrate 112 is removed to expose the semiconductor light-emitting elements 150 to the outside. Silicon oxide (SiOx) or the like may be coated on the wiring substrate coupled to the semiconductor light-emitting element 150 to form a transparent insulating layer (not shown).

Furthermore, it may further include the process of forming a phosphor layer on one surface of the semiconductor light-emitting element 150. For example, the semiconductor light-emitting element 150 may be a blue semiconductor light-emitting element for emitting blue (B) light, and red or green phosphor for converting the blue (B) light into the color of the sub-pixel may form a layer on one surface of the blue semiconductor light-emitting element.

The manufacturing method or structure of a display device using the foregoing semiconductor light-emitting element may be modified in various forms. For such an example, the foregoing display device may be applicable to a vertical semiconductor light-emitting element. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
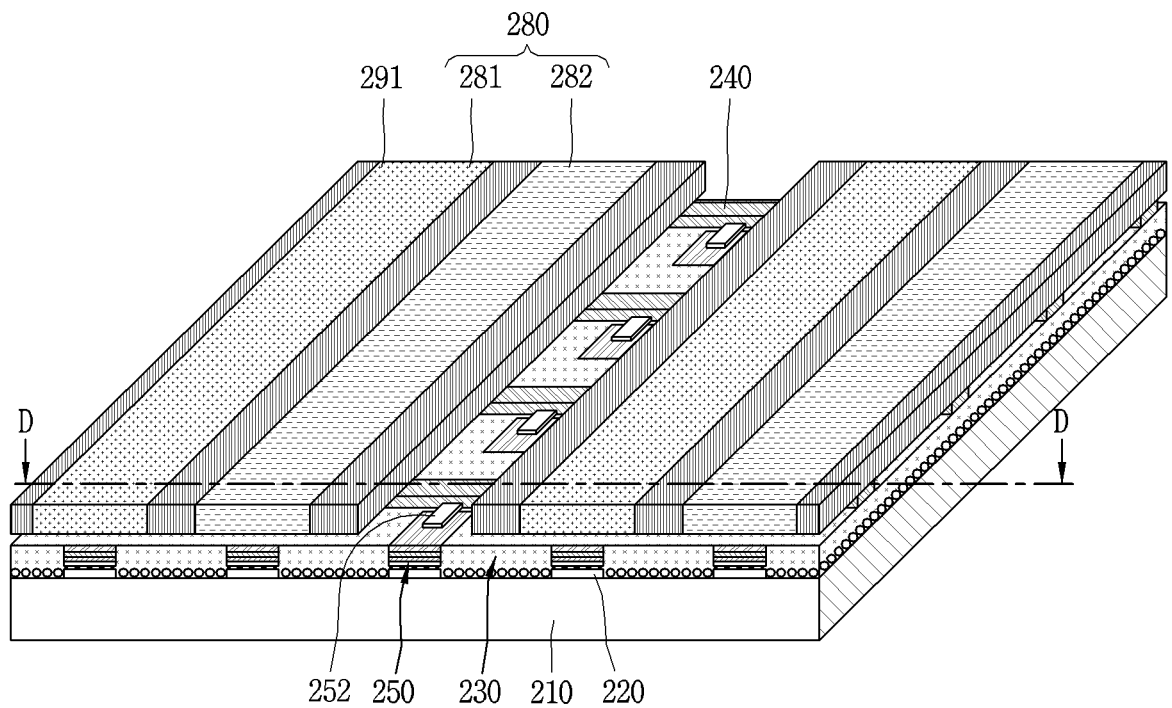
FIG. 7 is a perspective view showing a display device using a semiconductor light-emitting element according to another embodiment of the present disclosure.
Figure 8:
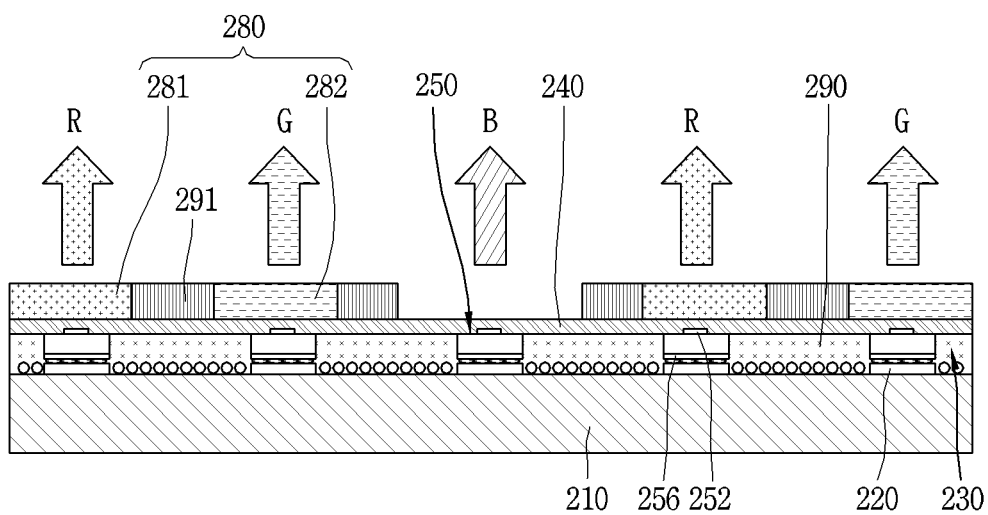
FIG. 8 is a cross-sectional view taken along line D-D in FIG. 7.
Figure 9:
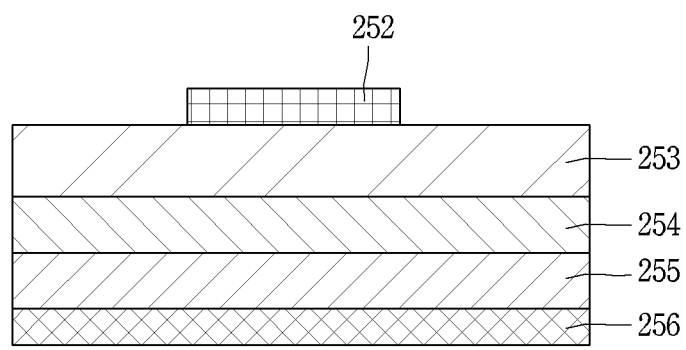
FIG. 9 is a conceptual view showing a vertical semiconductor light-emitting element in FIG. 8.

FIG. 7 is a perspective view illustrating a display device using a semiconductor light-emitting element according to another embodiment of the present disclosure. FIG. 8 is a cross-sectional view taken along line C-C in FIG. 7, and FIG. 9 is a conceptual view illustrating a vertical type semiconductor light-emitting element in FIG. 8.

According to the drawings, the display device may be display device using a passive matrix (PM) type of vertical semiconductor light-emitting element.

The display device may include a substrate 210, a first electrode 220, a conductive adhesive layer 230, a second electrode 240 and a plurality of semiconductor light-emitting elements 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similar to a display device to which a flip chip type light-emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light-emitting element 250 thereto, the semiconductor light-emitting element 250 is electrically connected to the first electrode 220. At this time, the semiconductor light-emitting element 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light-emitting element 250 and the first electrode 220.

In this manner, the semiconductor light-emitting element 250 is placed on the conductive adhesive layer 230, thereby configuring a separate sub-pixel in the display device. The semiconductor light-emitting element 250 has an excellent luminance characteristic, and thus it may be possible to configure individual sub-pixels even with a small size thereof. The size of the individual semiconductor light-emitting element 250 may be less than 80 µm in the length of one side thereof, and formed with a rectangular or square shaped element. In case of a rectangular shaped element, the size thereof may be less than 20×80 µm.

The semiconductor light-emitting element 250 may be a vertical structure.

A plurality of second electrodes 240 disposed in a direction of crossing the length direction of the first electrode 220, and electrically connected to the vertical semiconductor light-emitting element 250 may be located between vertical semiconductor light-emitting elements.

Referring to FIG. 9, the vertical semiconductor light-emitting element may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light-emitting element 250, thereby providing a great advantage capable of reducing the chip size.

Referring again to FIG. 8, a phosphor layer 280 may be formed on one surface of the semiconductor light-emitting element 250. For example, the semiconductor light-emitting element 250 is a blue semiconductor light-emitting element 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light-emitting element 251 at a location implementing a red sub-pixel, and a green phosphor 282 capable of converting blue light into green (G) light may be deposited on the blue semiconductor light-emitting element 251 at a location implementing a green sub-pixel. Furthermore, only the blue semiconductor light-emitting element 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display device to which a flip chip type light-emitting device is applied.

Taking the present embodiment into consideration again, the second electrode 240 is located between the semiconductor light-emitting elements 250, and electrically connected to the semiconductor light-emitting elements 250. For example, the semiconductor light-emitting elements 250 may be disposed in a plurality of rows, and the second electrode 240 may be located between the rows of the semiconductor light-emitting elements 250.

Since a distance between the semiconductor light-emitting elements 250 constituting individual pixels is sufficiently large, the second electrode 240 may be located between the semiconductor light-emitting elements 250.

The second electrode 240 may be formed with a bar-shaped electrode elongated in one direction, and disposed in a perpendicular direction to the first electrode.

Furthermore, the second electrode 240 may be electrically connected to the semiconductor light-emitting element 250 by a connecting electrode protruded from the second electrode 240. More specifically, the connecting electrode may be an n-type electrode of the semiconductor light-emitting element 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light-emitting element 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light-emitting element 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light-emitting element 250, the ITO material has a problem of bad adhesiveness with an n-type semiconductor. Accordingly, the second electrode 240 may be placed between the semiconductor light-emitting elements 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light-emitting elements 250. In other words, the partition wall 290 may be disposed between the vertical semiconductor light-emitting elements 250 to isolate the semiconductor light-emitting element 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light-emitting element 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. The partition wall 290 may include a black or white insulator according to the purpose of the display device.

If the second electrode 240 is precisely located on the conductive adhesive layer 230 between the semiconductor light-emitting elements 250, the partition wall 290 may be located between the semiconductor light-emitting element 250 and second electrode 240. Accordingly, individual sub-pixels may be configured even with a small size using the semiconductor light-emitting element 250, and a distance between the semiconductor light-emitting elements 250 may be relatively sufficiently large to place the second electrode 240 between the semiconductor light-emitting elements 250, thereby having the effect of implementing a flexible display device having a HD image quality.

Furthermore, according to the drawing, a black matrix 291 may be disposed between each phosphor layer to enhance contrast. In other words, the black matrix 291 can enhance the contrast of luminance.

In this manner, the semiconductor light-emitting element 250 is placed on the conductive adhesive layer 230, thereby configuring a separate sub-pixel in the display device. The semiconductor light-emitting element 250 has an excellent luminance characteristic, and thus it may be possible to configure individual sub-pixels even with a small size thereof. As a result, it may be possible to implement a full color display in which the sub-pixels of red (R), green (G) and blue (B) implement one pixel by means of the semiconductor light-emitting element.

In the display device using the semiconductor light-emitting element of the present disclosure described above, a laser lift-off (LLO) method or a chemical lift-off (CLO) method may be used to separate the semiconductor light— Can be used for separation.

Moreover, a stamp method or an electrostatic chuck method may be performed as a method of separating the semiconductor light-emitting element from the growth substrate and assembling the semiconductor light-emitting element on the substrate. However, there is a problem that an overtransfer problem occurs in the process of assembling a semiconductor light-emitting element to a substrate, resulting in poor processability. Accordingly, when the semiconductor light-emitting element is separated from the growth substrate and assembled to the substrate, the display device according to the present disclosure may prevent overtransfer and improve process speed.

Figure 10:
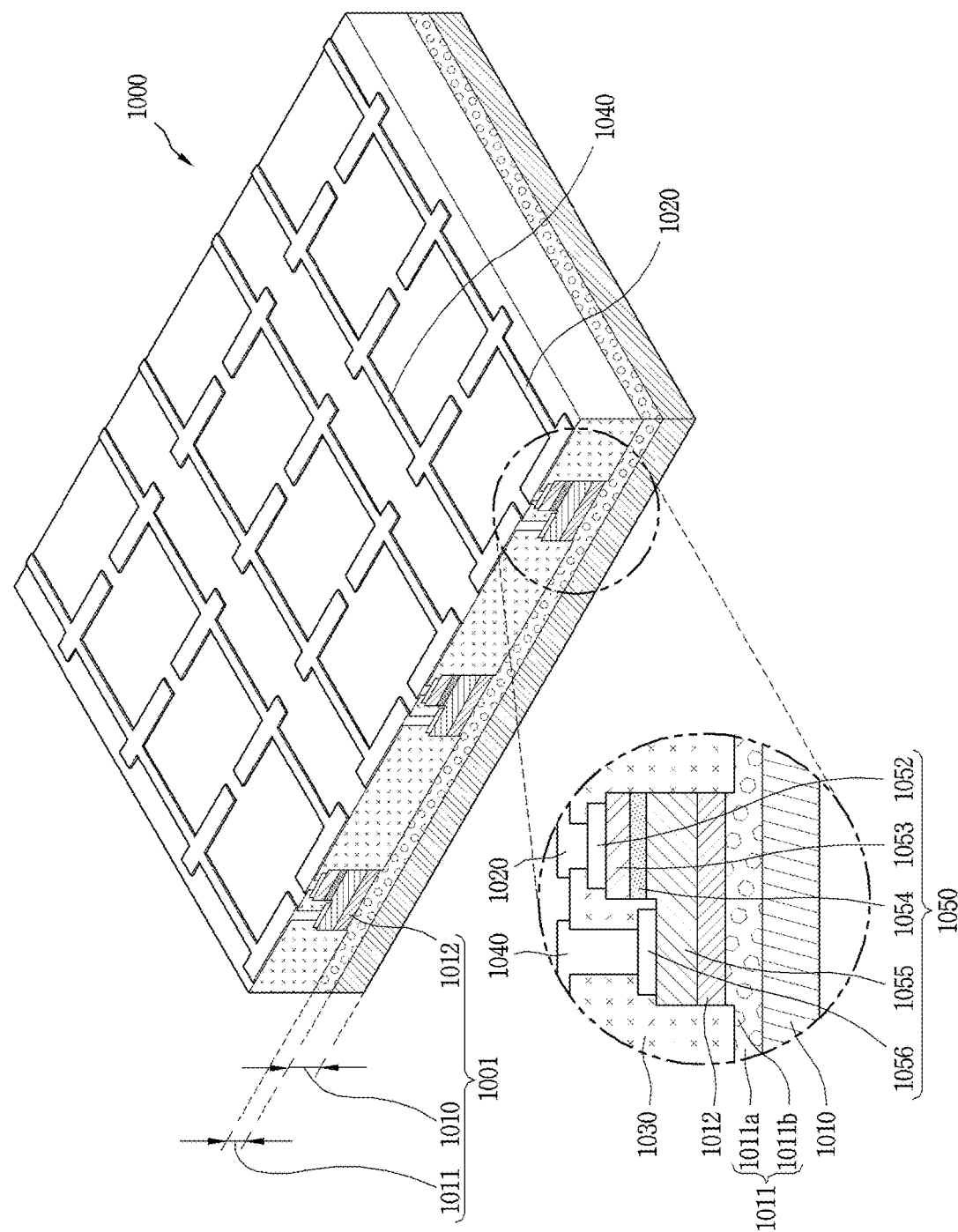
FIG. 10 is an enlarged view of portion "A" in FIG. 1 for explaining still another embodiment of the present disclosure of a display device having a new structure.

FIG. 10 is an enlarged view of portion "A" in FIG. 1 for explaining still another embodiment of the present disclosure of a display device having a new structure.

Referring to FIG. 10, the display device 1000 may include a substrate 1001, a first electrode 1020, an insulating member 1030, a second electrode 1040, and a plurality of semiconductor light-emitting elements 1050. Furthermore, the display device 1000 may be formed as a monochromatic surface light source by excluding a phosphor disposed on the semiconductor light-emitting element 1050.

The substrate 1001 may include a base substrate 1010, an insulating layer 1011, and a pad 1012. In detail, the base substrate 1010 may be made of various materials, and may be made to be flexible or inflexible. When the base substrate 1010 is made to be flexible, the base substrate 1010 may include glass or polyimide (PI). In addition, if it is an insulating and flexible material, any one such as polyethylene naphthalate (PEN), polyethylene terephthalate (PET) or the like may be used. Furthermore, the base substrate 1010 may be either one of transparent and non-transparent materials. Moreover, the base substrate 1010 may be composed of a plurality of layers.

In one embodiment, the insulating layer 1011 may be disposed on the base substrate 1010. In detail, the insulating layer 1011 may include an organic material 1011a and inorganic particles 1011b. The organic material 1011a may include at least one of a siloxane resin, an epoxy resin, and an acrylic resin.

Moreover, the inorganic particles 1011b may be at least one selected from a group consisting of SiOx, TiOx, AlOx, and ZnOx. In particular, the inorganic particles 1011b may be formed of micro-sized particles. In addition, at least part of the inorganic particles 1011b may be exposed to a surface of the organic material 1011a. Accordingly, the inorganic particles 1011b may be formed to protrude to a surface of the insulating layer 1011.

Meanwhile, the pad 1012 may be formed to protrude from the insulating layer 1011. In addition, the semiconductor light-emitting element 1050 may be assembled on the pad 1012. A layer having adhesive strength may be disposed on the pad 1012 to fix the semiconductor light-emitting element 1050 on one surface of the pad 1012. Furthermore, the pad 1012 may have adhesive strength to fix the semiconductor light-emitting element 1050 without an additional layer.

As shown in the drawing, when the semiconductor light-emitting element 1050 constituting the display device 1000 is a flip-chip type semiconductor light-emitting element, the pad 1012 may include at least one of a siloxane resin, an epoxy resin, and an acrylic resin having insulating properties. Meanwhile, when the semiconductor light-emitting element constituting the display device is a vertical semiconductor light-emitting element, the pad may be formed of a conductive material to serve as an electrode. This will be described in detail in FIG. 15, which will be described later.

Referring back to the drawing, the insulating layer 1011 and the pad 1012 may have different surface roughnesses. In one embodiment, a surface of the insulating layer 1011 on which at least part of the inorganic particles 1011b are formed to protrude may be formed to have a larger roughness than that of a surface of the pad 1012. Accordingly, in the process of assembling the semiconductor light-emitting element 1050, the assembly may be selectively formed on surfaces of the insulating layer 1011 and the pad 1012.

In detail, it becomes difficult to assemble the semiconductor light-emitting element 1050 on a surface of the insulating layer 1011 having a larger roughness. Accordingly, a problem in which the semiconductor light-emitting element 1050 is overtransferred on the insulating layer 1011 may be solved. In particular, the pad 1012 is formed to protrude from the insulating layer 1011, and thus even when the semiconductor light-emitting element 1050 is adhered by physical contact, a gap occurs between the insulating layer 1011 and the semiconductor light-emitting element 1050 even though the pad 1012 and the semiconductor light-emitting element 1050 come into contact with each other. As a result, adhesion between the insulating layer 1011 and the semiconductor light-emitting element 1050 may be prevented, and thus there is an effect of preventing the semiconductor light-emitting element 1050 from overtransferring onto the insulating layer 1011.

Meanwhile, the substrate 1001 may have a recessed groove in the insulating layer 1011 and the pad may be disposed in the recessed groove. This will be described in detail in FIG. 12, which will be described later.

Meanwhile, the semiconductor light-emitting element 1050 may include a first conductive semiconductor layer 1053, an active layer 1054, and a second conductive semiconductor layer 1055. In addition, the semiconductor light-emitting element 1050 may be formed to include a first conductive electrode 1052 formed on one surface of the first conductive semiconductor layer 1053 and a second conductive electrode 1056 formed on one surface of the second conductive semiconductor layer 1055.

More specifically, the first conductive semiconductor layer 1053 and the first conductive electrode 1052 may be a p-type electrode and a p-type semiconductor layer, respectively, and the second conductive semiconductor layer 1055 may be an n-type electrode and an n-type semiconductor layer, respectively. However, the present disclosure is not limited thereto, and the first conductive type may be n-type and the second conductive type may be p-type.

In one embodiment, the insulating member 1030 may be formed to surround the semiconductor light-emitting element 1050. In an embodiment, the insulating member 1030 may include polydimethylsiloxane (PDMS) or polymethylphenylsiloxane (PMPS) as a polymer material, and may include various insulating materials that surround the semiconductor light-emitting element 1050.

Meanwhile, the first electrode 1020 and the second electrode 1040 may be disposed on the insulating member 1030. In detail, the first conductive electrode 1056 and the second conductive electrode 1052 of the semiconductor light-emitting elements 1050 may be electrically coupled to the first electrode 1020 and the second electrode 1040, respectively, in a corresponding manner.

Figure 11:
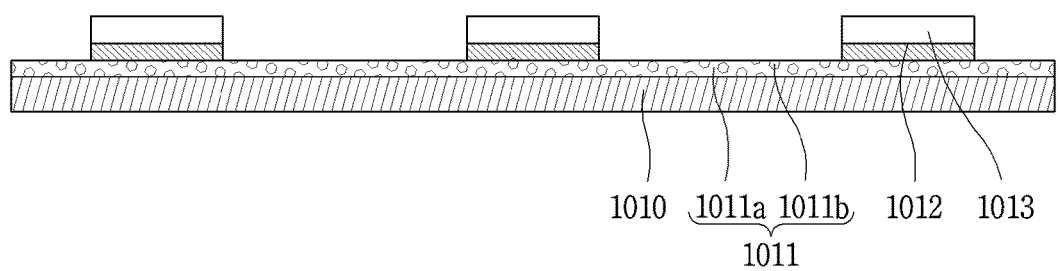
FIG. 11 is a conceptual view showing a method of manufacturing a substrate including an insulating layer and a pad in a display device of the present disclosure.
Figure 11:
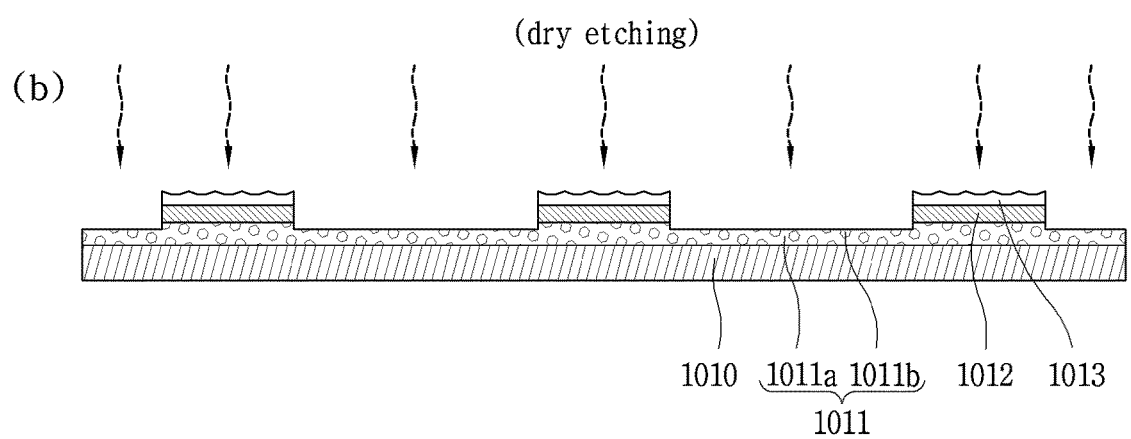
Figure 11:
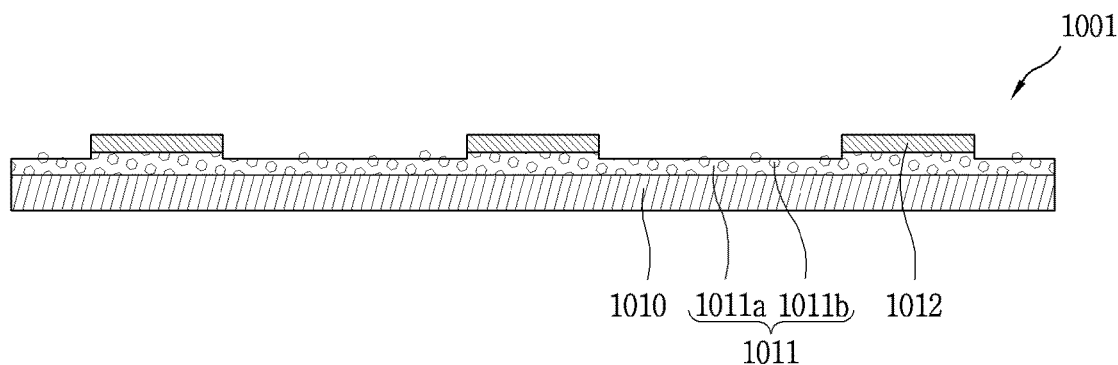

FIG. 11 is a conceptual view showing a method of manufacturing the substrate 1001 including the insulating layer 1011 and the pad 1012 in the display device 1000 of the present disclosure.

Referring to (a) of FIG. 11, an insulating layer 1011' including the organic material 1011a and the inorganic particles 1011b may be formed on the base substrate 1010, and the pad 1012 may be formed to protrude from the insulating layer 1011'. Furthermore, a pad passivation layer 1013' is formed on the pad 1012.

Referring to (b) of FIG. 11, a process of etching surfaces of the insulating layer 1011' and the pad passivation layer 1013' is performed, and an etching process is preferably performed by dry etching. Accordingly, the insulating layer 1011' is etched to form the insulating layer 1011 on which at least part of the inorganic particles 1011b are formed to protrude to the surface.

Referring to (c) of FIG. 11, the pad passivation layer 1013 on which the etching has been performed may be removed to form the substrate 1001.

Figure 12:
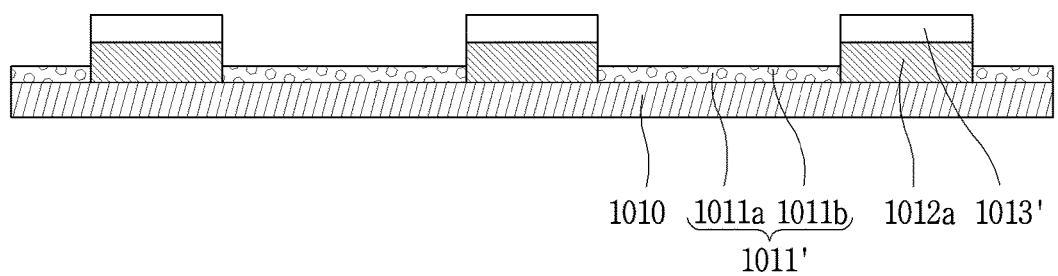
FIG. 12 is a conceptual view showing a method of manufacturing another substrate including an insulating layer and a pad in a display device of the present disclosure.
Figure 12:
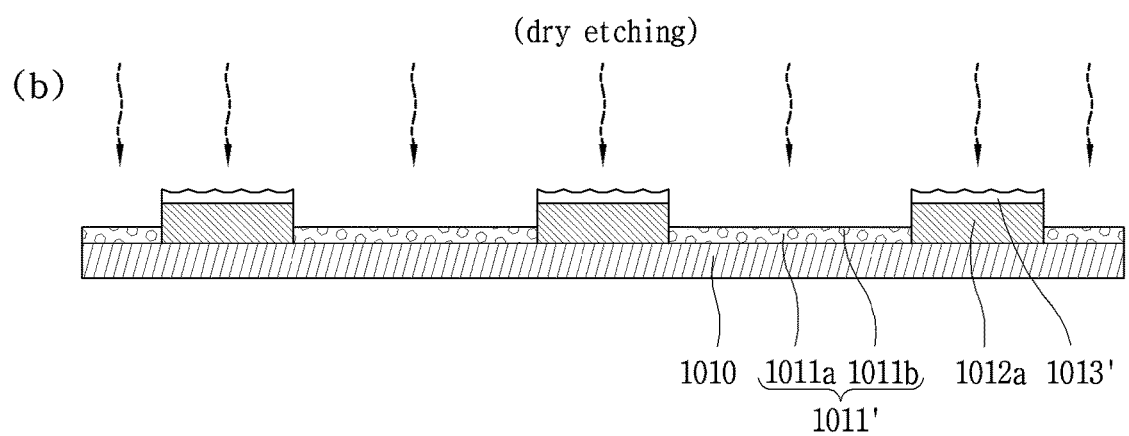
Figure 12:
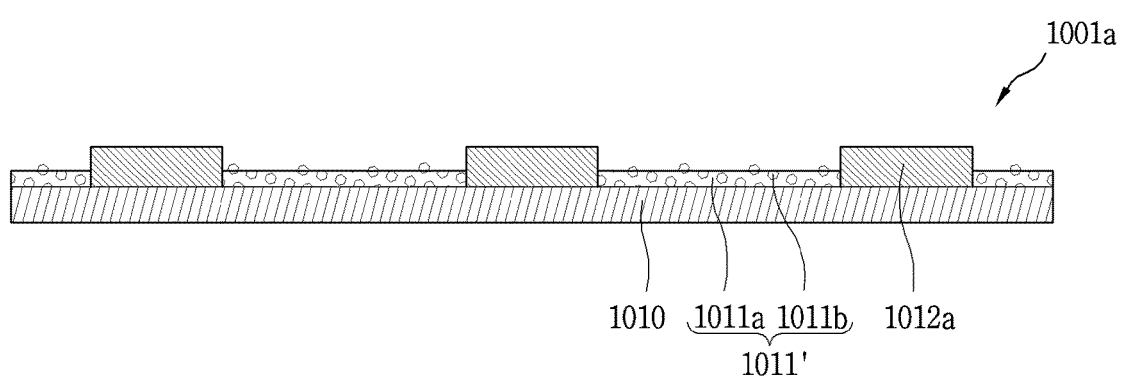

FIG. 12 is a conceptual view showing a method of manufacturing another substrate 1001a including the insulating layer 1011 and the pad 1012 in the display device 1000 of the present disclosure. In a method of manufacturing the substrate 1001a described below, the same or similar reference numerals are designated to the same or similar configurations to the foregoing embodiment, and the description thereof will be substituted by the earlier description.

Referring to (a) of FIG. 12, an insulating layer 1011' including an organic material 1011a and inorganic particles 1011b is formed on the base substrate 1010, and at least part of the insulating layer 1011' may be removed to form a groove recessed toward the base substrate 1010. Subsequently, a pad 1012a is formed in the recessed groove, and the pad 1012a is formed to protrude more than the insulating layer 1011'. A pad passivation layer 1013' is formed on the pad 1012a.

Referring to (b) of FIG. 12, a process of etching surfaces of the insulating layer 1011' and the pad passivation layer 1013' is performed, and an etching process is preferably performed by dry etching. Accordingly, the insulating layer 1011' is etched to form the insulating layer 1011 on which at least part of the inorganic particles 1011b are formed to protrude to the surface.

Referring to (c) of FIG. 12, the pad passivation layer 1013 on which the etching has been performed may be removed to form the substrate 1001a.

Figure 13:
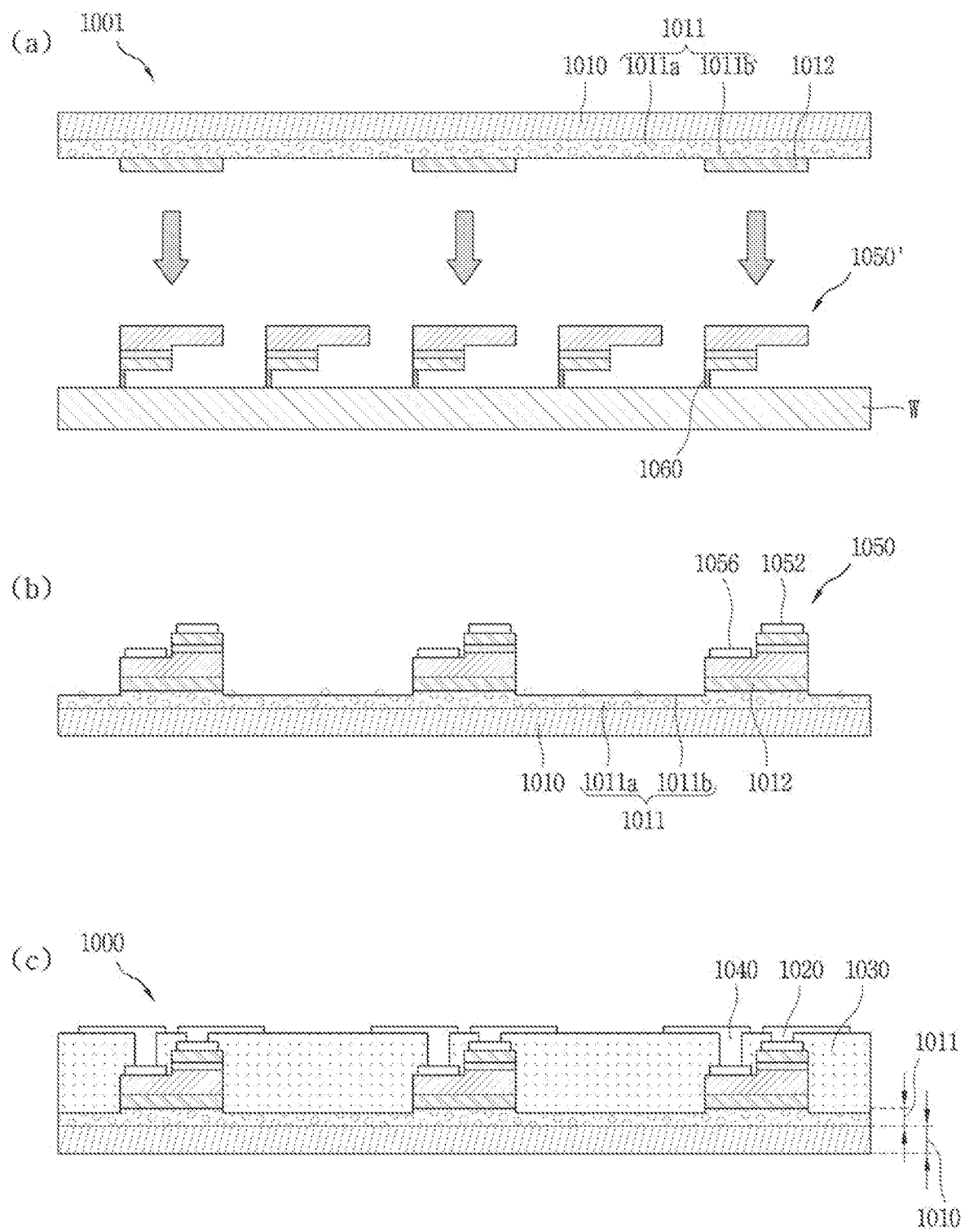
FIG. 13 is a conceptual view showing a method of manufacturing a display device according to the present disclosure through a stamp method.

FIG. 13 is a conceptual view showing a method of manufacturing the display device 1000 according to the present disclosure through a stamp method.

Referring to FIG. 13, a semiconductor light-emitting element 1050' may be assembled on a substrate 1001 including a base substrate 1010, an insulating layer 1011, and a pad 1012.

Referring to (a) of FIG. 13, the semiconductor light-emitting element 1050' is deposited on a growth substrate (W), and may be formed through a process such as etching. Moreover, the semiconductor light-emitting element 1050' may include an anchor structure 1060 formed by an etching process.

The semiconductor light-emitting element 1050' may be stamped on a substrate including the base substrate 1010, the insulating layer 1011, and the pad 1012, and separated from the anchor structure 1060, and transferred or assembled.

At this time, it may be difficult to assemble the semiconductor light-emitting element 1050' on a surface of the insulating layer 1011 having a larger roughness, thereby solving the problem of overtransferring the semiconductor light-emitting element 1050' onto the insulating layer 1011. In particular, the pad 1012 is formed to protrude from the insulating layer 1011, and thus even when the semiconductor light-emitting element 1050' is adhered by physical contact, a gap occurs between the insulating layer 1011 and the semiconductor light-emitting element 1050' even though the pad 1012 and the semiconductor light-emitting element 1050' come into contact with each other. As a result, contact between the insulating layer 1011 and the semiconductor light-emitting element 1050' may be prevented, thereby preventing the semiconductor light-emitting element 1050' from overtransferring onto the insulating layer 1011.

Referring to (b) of FIG. 13, the semiconductor light-emitting element 1050' may be separated from the growth substrate (W) and assembled on the pad 1012, and then the first conductive electrode 1052 and the second conductive electrode 1056 may be formed to form the semiconductor light-emitting element 1050 including the first conductive electrode 1052 and the second conductive electrode 1056.

Referring to (c) of FIG. 13, an insulating layer 1030 surrounding the semiconductor light-emitting element 1050 may be formed, and the first electrode 1020 and the second electrode 1040 may be formed to manufacture the display device 1000.

Figure 14:
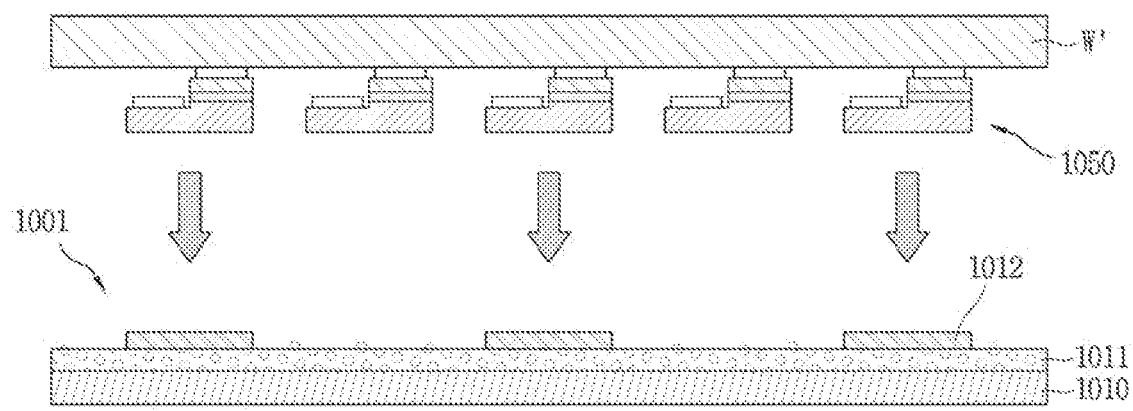
FIG. 14 is a conceptual view showing a method of manufacturing a display device according to the present disclosure through a doner substrate.
Figure 14:
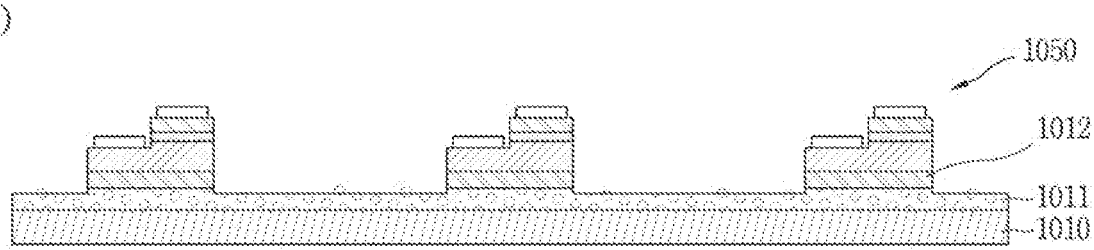
Figure 14:
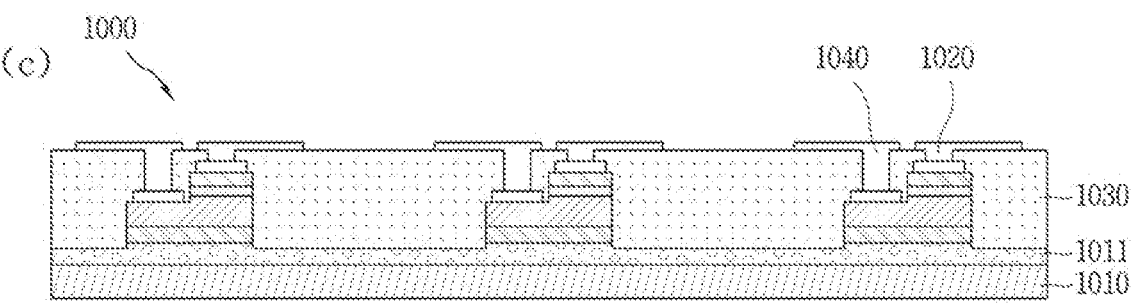

FIG. 14 is a conceptual view showing a method of manufacturing the display device 1000 according to the present disclosure through a doner substrate (W').

Referring to FIG. 14, the display device 1000 may be formed by transferring the semiconductor light-emitting elements 1050 manufactured on the foregoing growth substrate to the donor substrate (W'), and then selectively assembling some of the semiconductor light-emitting elements 1050 on a substrate including the base substrate 1010, the insulating layer 1011, and the pad 1012.

Referring to (a) of FIG. 14, the donor substrate (W') may be formed of a material that can be deformed by an external force having elasticity. In other words, when the semiconductor light-emitting element 1050 is transferred while the donor substrate (W') is brought into contact with the substrate by pressure, it may be overtransferred by an electrostatic force and a van der Weals force.

However, in (a) of FIG. 14, it may be difficult to assemble the semiconductor light-emitting element 1050' on a surface of the insulating layer 1011 having a larger roughness, thereby solving the problem of overtransferring the semiconductor light-emitting element 1050' onto the insulating layer 1011. In particular, the pad 1012 is formed to protrude from the insulating layer 1011, and thus even when the semiconductor light-emitting element 1050 is adhered by physical contact, a gap occurs between the insulating layer 1011 and the semiconductor light-emitting element 1050 even though the pad 1012 and the semiconductor light-emitting element 1050 come into contact with each other. As a result, contact between the insulating layer 1011 and the semiconductor light-emitting element 1050 may be prevented, thereby preventing the semiconductor light-emitting element 1050 from overtransferring onto the insulating layer 1011.

Meanwhile, the process in which the semiconductor light-emitting element 1050 is separated and disposed on the pad 1012 may be performed by a transfer method using the donor substrate (W') as described above, and the semiconductor light-emitting element may be transferred using a laser lift-off method (LLO) or a chemical lift-off method (CLO) in which the semiconductor light-emitting element is immediately separated from the growth substrate.

Referring to (b) of FIG. 14, the semiconductor light-emitting element 1050 disposed on the pad 1012 may be formed by various transfer methods described above.

Referring to (c) of FIG. 14, an insulating layer 1030 surrounding the semiconductor light-emitting element 1050 may be formed, and the first electrode 1020 and the second electrode 1040 may be formed to manufacture the display device 1000.

The substrate used in FIGS. 13 and 14 described above may include a substrate 1001a having a recessed groove in the insulating layer described in FIG. 12 and having the pad formed thereon.

Figure 15:
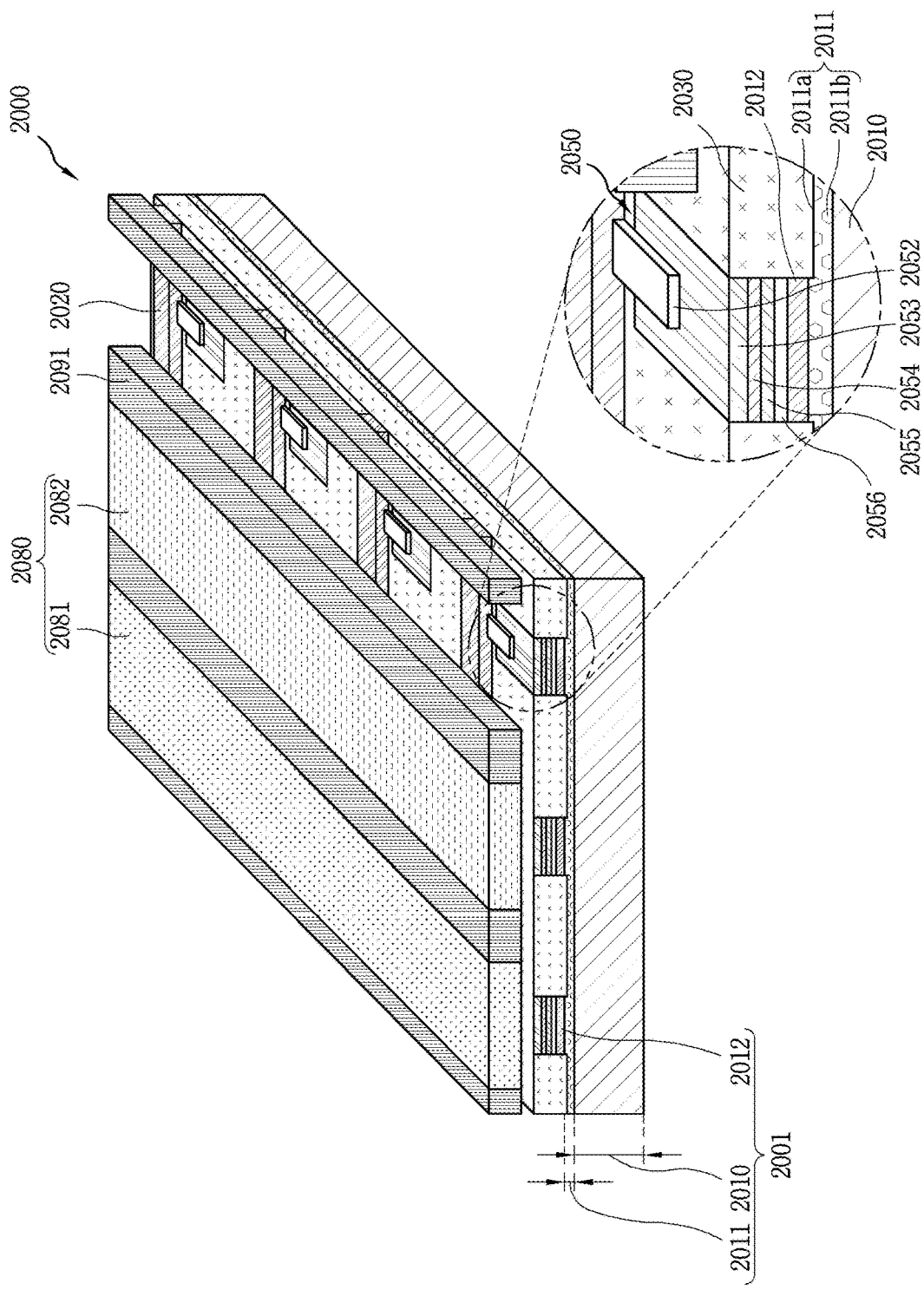
FIG. 15 is an enlarged view of portion "A" in FIG. 1 for explaining still another embodiment of the present disclosure to which a display device having a new structure is applied.

FIG. 15 is an enlarged view of portion "A" in FIG. 1 for explaining still another embodiment of the present disclosure to which a display device 2000 having a new structure is applied. According to the display device 2000 which will be described below, the same or similar reference numerals are designated to the same or similar configurations to the foregoing embodiment, and the description thereof will be substituted by the earlier description.

Referring to FIG. 15, a semiconductor light-emitting element forming the display device 2000 may be formed with a vertical semiconductor light-emitting element 2050 and an insulating member 2030. Accordingly, a pad 2012 may be formed of a conductive material to serve as an electrode. The display device 2000 can include a base substrate 2010, an insulating layer 2011, and a pad 2012. The insulating layer 2011 can include an organic material 2011a and inorganic particles 2011b. The semiconductor light-emitting element 2050 can include a first conductive semiconductor layer 2053, an active layer 2054, and a second conductive semiconductor layer 2055.

Furthermore, the display device 2000 may further include a phosphor layer 2080 formed on a surface of the plurality of semiconductor light-emitting elements 2050. For example, the semiconductor light-emitting element 2050 is a blue semiconductor light-emitting element that emits blue (B) light, and the phosphor layer 2080 performs the role of converting the blue (B) light into the color of a sub-pixel. The phosphor layer 2080 may be a red phosphor layer 2081 or green phosphor layer 2082 constituting individual pixels. Furthermore, in order to improve the contrast of the phosphor layer 2080, the display device may further include a black matrix 2091 disposed between each phosphor.

In one embodiment, the first conductive electrode 2056 and the second conductive electrode 2052 of the semiconductor light-emitting elements 2050 may be electrically coupled to the first electrode 2020 and the second electrode 2040, respectively, in a corresponding manner.

In detail, wiring (not shown) may be formed on the insulating layer 2011 to form a connection between the semiconductor light-emitting elements 2050. Accordingly, the pad 2012 corresponding to the second conductive electrode 2056 may be selected from a group consisting of AuSn, InSn, and In. Accordingly, an electrical connection between the wiring and the semiconductor light-emitting element 2050 may be formed. Moreover, since the pad 2012 is disposed under the semiconductor light-emitting element 2050, the pad 2012 selected from the group consisting of AuSn, InSn and In having excellent thermal conductivity may improve the heat dissipation performance of the display device 2000. The pad 2012 formed by being selected from the group consisting of AuSn, InSn, and In may have adhesive strength by itself according to a process, and thus the semiconductor light-emitting element 2050 may be fixed on the pad 2012 without an additional layer.

Figure 16:
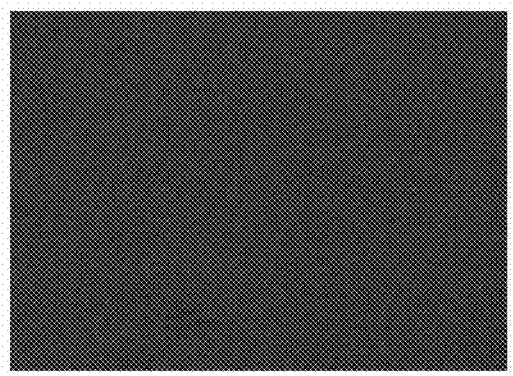
FIG. 16 shows a result of the semiconductor light-emitting element overtransfer test experiment according to an embodiment of the present disclosure and a comparative example.
Figure 16:
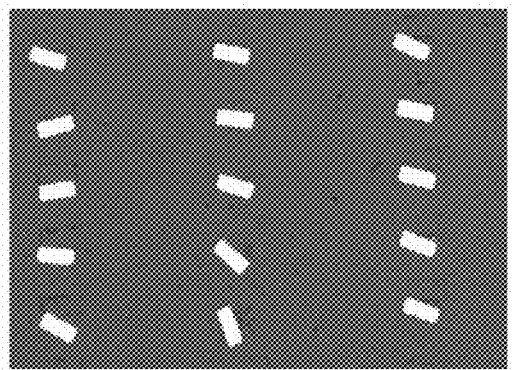

FIG. 16 shows a result of the semiconductor light-emitting element overtransfer test experiment according to an embodiment of the present disclosure and a comparative example.

(a) of FIG. 16 is an example of an overtransfer test experiment of a semiconductor light-emitting element according to an embodiment. In (a) of FIG. 16, a pad is not formed, and an insulating layer in which part of inorganic particles are protruded is formed on a base substrate, and semiconductor light-emitting elements are transferred to test whether they are overtransferred. Accordingly, due to an increase in the roughness of a surface of the insulating layer through dry etching, it appeared dark on an image, but overtransferred semiconductor light-emitting elements do not appear on the insulating layer as a result of the overtransfer test.

Meanwhile, (b) of FIG. 16 is an example of a semiconductor light-emitting element overtransfer test experiment according to a comparative example. In (b) of FIG. 16, a pad is not formed and an insulating layer including inorganic particles is formed on a base substrate, but dry etching is not performed. Looking at an experimental result, it can be seen that semiconductor light-emitting elements are overtransferred onto the insulating layer.

Accordingly, in an embodiment to which the substrate of the present disclosure is applied, it can be seen that overtransfer failure can be improved in the process of assembling the semiconductor light-emitting elements.

The configurations and methods according to the above-described embodiments will not be applicable in a limited way to a display device using the foregoing semiconductor light-emitting element, and all or part of each embodiment may be selectively combined and configured to make various modifications thereto.

What is claimed is:

1. A display device having a plurality of semiconductor light-emitting elements on a substrate, wherein the substrate comprises:
    a base substrate;
    one insulating layer covering the base substrate, wherein the one insulating layer has one recessed groove extending to the base substrate below the one insulating layer by removing the one insulating layer;
    a pad positioned in the recessed groove formed in the one insulating layer, contacting the one insulating layer, and contacting the base substrate through the recessed groove, the pad being formed to have a thickness thicker than a thickness of the one insulating layer and to protrude from an uppermost surface of the one insulating layer; and
    one of the plurality of semiconductor light-emitting elements assembled on the pad,
    wherein,
    the one insulating layer comprises inorganic particles, and at least part of some of the inorganic particles are formed to protrude from the uppermost surface of the one insulating layer that is not in contact with the base substrate,
    a height of an uppermost surface of the pad that is not in contact with the base substrate is higher than a height of the uppermost surface of the one insulating layer, and
    the pad is inserted in the recessed groove of the one insulating layer from which the one insulating layer has been removed, so that the entire uppermost surface of the pad including the one semiconductor light-emitting element is not covered by the one insulating layer.

2. The display device of claim 1, wherein the one insulating layer comprises at least one of a siloxane resin, an epoxy resin, and an acrylic resin.

3. The display device of claim 1, wherein the inorganic particles comprise at least one selected from a group consisting of SiOx, TiOx, AlOx, and ZnOx.

4. The display device of claim 1, wherein the pad comprises at least one of a siloxane resin, an epoxy resin, and an acrylic resin.

5. The display device of claim 1, wherein a surface roughness of the one insulating layer is greater than a surface roughness of the pad.

6. The display device of claim 1, wherein the pad is formed to contact the base substrate.

7. The display device of claim 1, further comprising:
    an insulating member on the one insulating layer and the one of the plurality semiconductor light-emitting elements; and
    an electrode on an upper surface of the insulating member and connected to the one of the plurality semiconductor light-emitting elements.

8. The display device of claim 1, wherein an end edge of the one insulating layer contacts a lateral surface of the pad, and
    wherein the end edge of the one insulating layer is positioned lower than the uppermost surface of the pad.

9. A method of manufacturing a display device, the method comprising:
    covering a base substrate with one insulating layer comprising inorganic particles on a base substrate;
    removing the one insulating layer to form a recessed groove of the one insulating layer that reaches the base substrate;
    placing a pad thicker than a thickness of the one insulating layer in the recessed groove formed in the one insulating layer such that the pad contacts the one insulating layer, thereby forming the pad protruding from the base substrate;
    forming a pad passivation layer on the pad;
    etching the one insulating layer to form the one insulating layer in which some of the inorganic particles protrude from an uppermost surface of the one insulating layer that is not in contact with the base substrate; and
    removing the pad passivation layer, and assembling a semiconductor light-emitting element on the pad,
    wherein a height of an uppermost surface of the pad that is not in contact with the base substrate is higher than the height of the uppermost surface of the one insulating layer and the uppermost surface of the pad is not covered by the one insulating layer.

10. The method of claim 9, wherein in the forming of the one insulating layer, the one insulating layer comprises at least one of a siloxane resin, an epoxy resin, and an acrylic resin.

11. The method of claim 9, wherein in the forming of the one insulating layer, the inorganic particles comprise at least one selected from a group consisting of SiOx, TiOx, AlOx, and ZnOx.

12. The method of claim 9, wherein a surface roughness of the one insulating layer is greater than a surface roughness of the pad.

13. The method of claim 9, wherein the pad is formed to contact the base substrate.

14. The method of claim 9, further comprising:
forming an insulating member on the one insulating layer and the semiconductor light-emitting element; and
forming an electrode on an upper surface of the insulating member to be connected to the semiconductor light-emitting element.

15. The method of claim 9, wherein an end edge of the one insulating layer contacts a lateral surface of the pad, and
wherein the end edge of the one insulating layer is positioned lower than the uppermost surface of the pad.

16. A display device comprising:
a base substrate; and
a plurality of semiconductor light-emitting elements arranged on the base substrate,
wherein the base substrate includes:
one insulating layer covering the base substrate, wherein the one insulating layer has one recessed groove extending to the base substrate below the one insulating layer by removing the one insulating layer, the one insulating layer comprising an uppermost surface of the one insulating layer that is not in contact with the base substrate;
a pad positioned in the recessed groove formed in the one insulating layer, contacting the one insulating layer, and contacting the base substrate through the recessed groove, the pad being formed to have a thickness thicker than a thickness of the one insulating layer and to protrude from the uppermost surface of the one insulating layer; and
one of the plurality of semiconductor light-emitting elements assembled on the pad, and
wherein,
the one insulating layer comprises an organic layer and inorganic particles that protrude from a surface of the organic layer of the uppermost surface of the one insulating layer,
a height of an uppermost surface of the pad that is not in contact with the base substrate is higher than a height of the uppermost surface of the one insulating layer, and
the pad is inserted in the recessed groove of the one insulating layer from which some of the one insulating layer has been removed, so that the entire uppermost surface of the pad including the one semiconductor light-emitting element is not covered by the one insulating layer.

17. The display device of claim 16, wherein a surface roughness of the one insulating layer is greater than a surface roughness of the pad.

18. The display device of claim 16, wherein the pad is formed to protrude more than the one insulating layer relative to the base substrate.

19. The display device of claim 16, further comprising:
an insulating member on the one insulating layer and the one of the plurality semiconductor light-emitting elements; and
an electrode on an upper surface of the insulating member and connected to the one of the plurality semiconductor light-emitting elements.

20. The display device of claim 16, wherein an end edge of the one insulating layer contacts a lateral surface of the pad, and
wherein the end edge of the one insulating layer is positioned lower than the uppermost surface of the pad.

* * * * *